United States Patent

Hama

[11] Patent Number: 6,079,357
[45] Date of Patent: Jun. 27, 2000

[54] PLASMA PROCESSING APPARATUS

[75] Inventor: Kiichi Hama, Chino, Japan

[73] Assignees: Tokyo Electron Yamanashi Limited, Nirasaki; Japan Science and Technology Corporation, Kawaguchi, both of Japan

[21] Appl. No.: 09/173,177

[22] Filed: Oct. 15, 1998

[30] Foreign Application Priority Data

Oct. 21, 1997 [JP] Japan .................................. 9-307919

[51] Int. Cl.[7] .............................. C23C 16/00; H05H 1/00
[52] U.S. Cl. ........................................ 118/723 I; 156/345
[58] Field of Search .................... 156/345; 118/723 I, 118/723 E, 723 MN, 723 MR

[56] References Cited

U.S. PATENT DOCUMENTS 5,433,812  7/1995  Cuomo et al. ........................... 156/345
5,580,385  12/1996  Paranjpe et al. ....................... 118/723 I

FOREIGN PATENT DOCUMENTS 3-22525    1/1991  Japan .
8-144072   6/1996  Japan .
97/08734   3/1997  WIPO ............................. H01J 37/32

*Primary Examiner*—Shrive Beck
*Assistant Examiner*—P. Hassanzadeh
*Attorney, Agent, or Firm*—Oblon, Spivak, McClelland, Maier & Neustadt, P.C.

[57] ABSTRACT

An inductively coupled type dry etching apparatus has an RF antenna disposed on the ceiling wall of a process chamber. A susceptor is arranged in the process chamber, for mounting a semiconductor wafer thereon. The ceiling wall has a matrix of alumina ceramic, and heat generating elements of a salt of a transition metal oxide, which are dispersed in the matrix and capable of self-generating heat by an RF electric field.

17 Claims, 3 Drawing Sheets

PLASMA PROCESSING APPARATUS

BACKGROUND OF THE INVENTION

The present invention relates to an apparatus for subjecting a target object to a plasma process in a semiconductor processing system by using a plasma and, more particularly, to an inductively coupled type dry etching apparatus. The term "semiconductor processing" used herein includes various kinds of processes which are performed to manufacture a semiconductor device or a structure having wiring layers, electrodes, and the like to be connected to a semiconductor device, on a target substrate, such as a semiconductor wafer or an LCD substrate, by forming semiconductor layers, insulating layers, and conductive layers in predetermined patterns on the target substrate.

As a plasma processing apparatus used in semiconductor processing systems, there is an inductively coupled type dry etching apparatus. This dry etching apparatus generally has a process chamber with a ceiling of a dielectric wall, on which an annular or spiral RF (radio-frequency) antenna is disposed.

The dielectric wall has an inner surface exposed to the interior atmosphere of the process chamber, and by-products derived from radicals in a plasma tend to adhere to the exposed inner surface during a plasma process. By-products adhering to the exposed inner surface increase the dielectric constant of the exposed inner surface, thereby lowering energy efficiency. Further, the amount of radicals present in the process chamber varies at every process, depending on the amount of by-products adhering to the exposed inner surface, thereby causing the process to be unreliable. As a result, problems arise in that the throughput of the process is decreased and the planar uniformity of the process is deteriorated. Accordingly, it is preferable to minimize the amount of by-products adhering to the exposed inner surface of the dielectric wall in the inductively coupled type plasma processing apparatus.

Jpn. Pat. Appln. KOKAI Publication No. 8-144072 discloses an inductively coupled type plasma processing apparatus in which a resistance heating body is embedded in a dielectric wall. Generally, if a surface exposed to a plasma is kept at a high temperature, the adhering coefficient of by-products relative to the surface becomes low. Accordingly, the dielectric wall is kept at a high temperature by the resistance heating body, so that the exposed surface of the dielectric wall is prevented from being stained with by-products.

However, the resistance heating body embedded in the dielectric wall requires a complicated structure of the dielectric wall. Further, it is necessary for the resistance heating body to be provided with a power supply, an attachment for the power supply, a controller, and the like. These members cause the initial cost of the entire apparatus to be higher. Furthermore, since the coefficient of thermal expansion of the dielectric wall differs from that of the resistance heating body, cracks may be generated in the dielectric wall due to repeated thermal expansion and contraction over a long period of time.

BRIEF SUMMARY OF THE INVENTION

It is an object of the present invention to provide a plasma processing apparatus which can heat up the exposed inner surface of a dielectric wall with a simple structure.

It is another object of the present invention to provide a plasma processing apparatus which can heat up the exposed inner surface of a dielectric wall while hardly lowering the service life of the dielectric wall.

According to the present invention, there is provided an apparatus for subjecting a target object to a plasma process by using a plasma. The apparatus comprising an airtight process chamber formed in a process vessel; a support member arranged in the process chamber, for supporting the target object in the process chamber; a gas supply system for supplying a process gas into the process chamber; an exhaust system for exhausting and setting the process chamber at a vacuum; an RF antenna for generating an RF electric field for exciting the process gas in the process chamber to convert the process gas into a plasma; a power supply for supplying an RF power to the RF antenna; and an interposed wall which has an exposed inner surface exposed to the process chamber and is interposed between the process chamber and the RF antenna.

In a first aspect of the present invention, the interposed wall comprises a matrix consisting essentially of a dielectric material, and heat generating elements dispersed in the matrix and capable of self-generating heat by the RF electric field.

In a second aspect of the present invention, the interposed wall comprises a matrix consisting essentially of a semiconductor.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

DETAILED DESCRIPTION OF THE INVENTION

Figure 1:
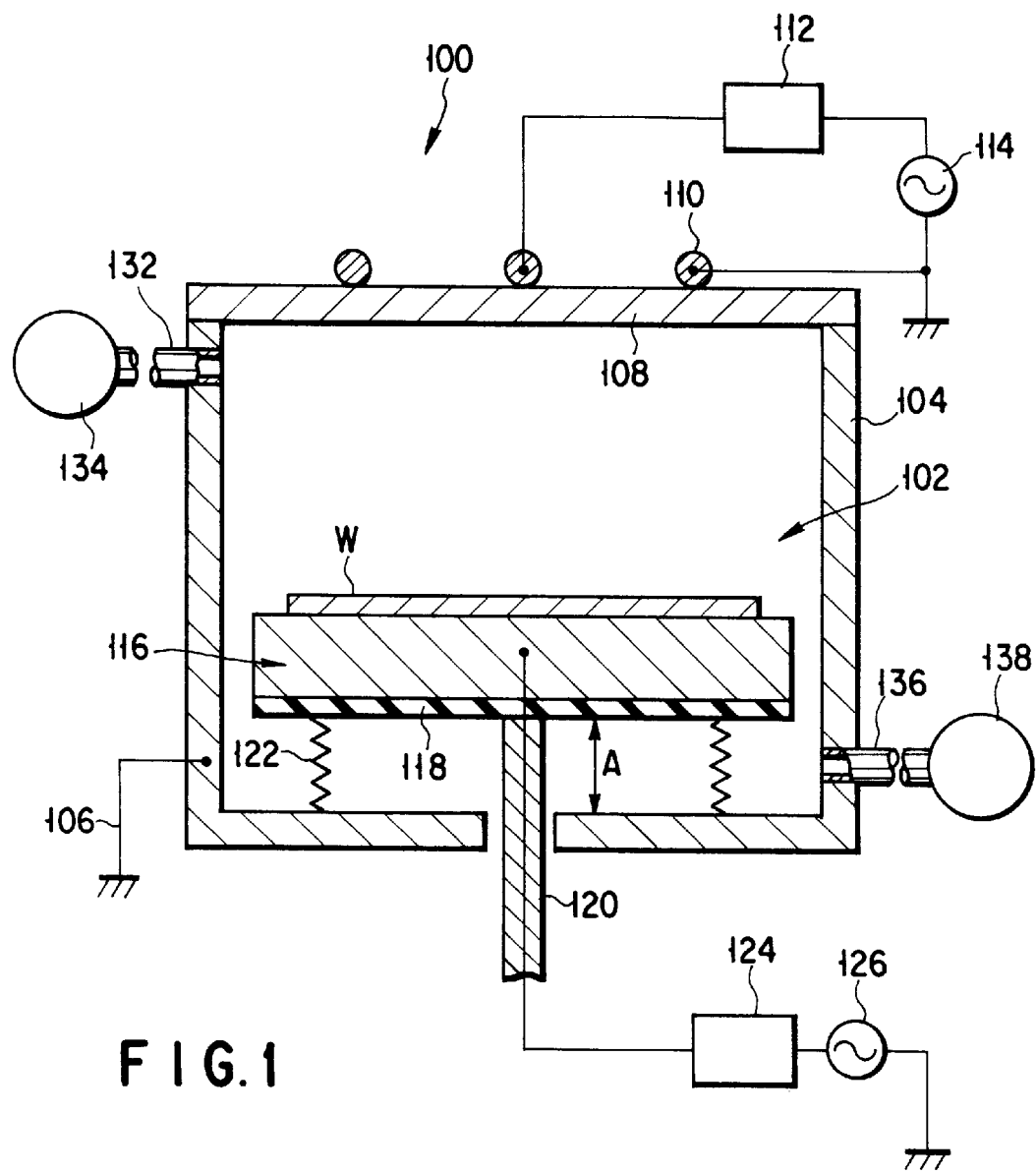
FIG. 1 is a schematic diagram showing an etching apparatus according to an embodiment of the present invention.

Embodiments of the present invention will be described hereinafter with reference to the accompanying drawings. In the following description, the constituent elements having substantially the same function and arrangement are denoted by the same reference numerals, and repetitive descriptions will be made only when necessary.

FIG. 1 is a schematic diagram showing an inductively coupled type dry etching apparatus 100 according to an embodiment of the present invention.

An airtight process chamber 102 of the etching apparatus 100 is constituted by a substantially cylindrical process vessel 104 made of a conductive material, such as stainless steel, and a ceiling wall 108 consisting essentially of a dielectric material. The process vessel 104 itself is grounded through a ground line 106. The ceiling wall 108 will be explained later in detail. A spiral RF (radio-frequency) antenna 110 is arranged on the ceiling wall 108. The RF antenna 110 is connected, through a matching unit 112, to a first RF power supply 114 which can output a plasma generating RF power, such as an RF power of 13.56 MHz.

A susceptor 116 made of a conductive material and forming a lower electrode is arranged in the lower portion of the process chamber 102. A semiconductor wafer W is placed on the work surface of the susceptor 116 and fixed thereto by, e.g., an electrostatic chuck (not shown). An elevating shaft 120 is mounted on the susceptor 116 through an insulating member 118 arranged on the bottom surface portion of the susceptor 116. The elevating shaft 120 is connected to an elevating mechanism (not shown). Accordingly, upon operation of the elevating mechanism, the susceptor 116 can be vertically moved (in the direction of the double-headed arrow A in FIG. 1) through the elevating shaft 120. A bellows 122 made of an airtight member is mounted on the insulating member 118 around the elevating shaft 120 and the bottom surface of the process chamber 102 to extend between them. Hence, even if the susceptor 116 is moved vertically, the airtightness in the process chamber 102 is not impaired. The susceptor 116 is connected, through a matching unit 124, to a second RF power supply 126 that can output a bias RF power, such as an RF power of 380 kHz.

The process chamber 102 is connected to a gas supply line 132 of a process gas supply system. The gas supply line 132 is connected to a gas source unit 134 through an opening/closing valve and a flow control valve (not shown). The gas source unit 134 has gas sources of a plurality of different gases to be supplied to the process chamber 102, e.g., $CF_4$, $C_4F_8$, CO, $O_2$, Ar, and $N_2$.

The process chamber 102 is connected to an exhaust line 136 of the exhaust system. The exhaust line 136 is connected to an exhaust pump 138 through an opening/closing valve and a flow control valve (not shown). The exhaust pump 138 can exhaust the process chamber 102 and set the process chamber 102 at a vacuum of, e.g., from 10 mTorr to 100 mTorr.

In the etching apparatus 100 shown in FIG. 1, a process is performed as follows.

First, the wafer W is placed on the susceptor 116 arranged in the process chamber 102. Subsequently, the process chamber 102 is exhausted by the exhaust system connected to the process chamber 102, thereby setting the entire interior of the process chamber 102 to a predetermined pressure-reduced atmosphere. While the process chamber 102 is continuously exhausted, a process gas is supplied from the process gas supply system to the process chamber 102.

In this state, a plasma generating RF power is applied to the RF antenna 110 so that the process gas supplied to the process chamber 102 is excited and dissociated, thereby generating a high-density plasma. Simultaneously, a bias RF power is applied to the susceptor 116 to guide an etchant in the plasma onto the surface of the wafer W, thereby etching the wafer W.

Figure 2:
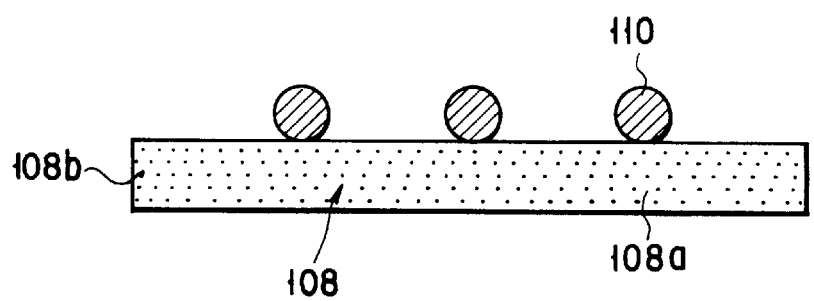
FIG. 2 is a cross-sectional view showing a ceiling wall used in the apparatus shown in FIG. 1.

FIG. 2 is a cross-sectional view showing a ceiling wall 108 used in the apparatus 100 shown in FIG. 1.

As shown in FIG. 2, the ceiling wall 108 has a matrix 108a consisting essentially of a dielectric material, and heat generating elements 108b dispersed in the matrix 108 and capable of self-generating heat, using an RF electric field generated by the RF antenna 110. The heat generating elements 108b is caused to generate heat (joule heat) by the RF electric field, and heat up the inner surface of the ceiling wall 108 exposed to the process chamber 102, so that the exposed inner surface is prevented from being stained with by-products during a plasma process.

The ceiling wall 108 having such a property can be formed by doping, e.g., alumina ceramic with a salt of a transition metal oxide, i.e., a double oxide of a transition metal oxide and an alkaline earth metal oxide. The calorific value of the ceiling wall 108 can be controlled by adjusting the dose of the salt of a transition metal oxide. The alumina ceramic can be doped with the salt of a transition metal oxide, such as $CaTiO_3$, $MgTiO_3$, $SrTiO_3$, or $BaTiO_3$, as follows.

First, alumina ceramic powder is mixed with an alkaline earth metal, such as Ca, Mg, Sr, or Ba, at about 1.0 to 6.0 Wt %, and a transition metal, such as Ti, at about 0.5 to 6.0 Wt %. Then, the alumina ceramic powder mixed with the alkaline earth metal and the transition metal is sintered by heating it for 1 to 7 hours, and preferably for 2 hours, at 1500 to 1650° C., in a reduction atmosphere. With this operation, the alumina ceramic is doped with the salt of a transition metal oxide produced therein. In this sintering operation, a sintering aid, such as $SiO_2$ may be preferably added to the alumina ceramic.

In the sintered body thus formed to constitute the ceiling wall 108, the electric resistance of the alumina ceramic, i.e., the matrix 108a, is lowered by the salt of a transition metal oxide, i.e., the heat generating elements 108b. In other words, the heat generating elements 108b are a conductive material or impurity with which the dielectric material forming the matrix 108a is doped. The dose of the heat generating elements 108b determines the ratio, in the energy from the RF antenna 110, between the amount to be consumed for the inductive heating and the amount to contribute to exciting an inductively coupled plasma.

Figure 7A:
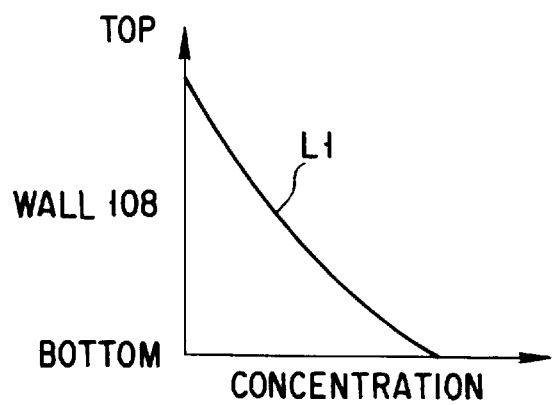
FIGS. 7A and 7B are views showing distributions of impurity concentration in the ceiling walls or the partition walls.
Figure 7B:
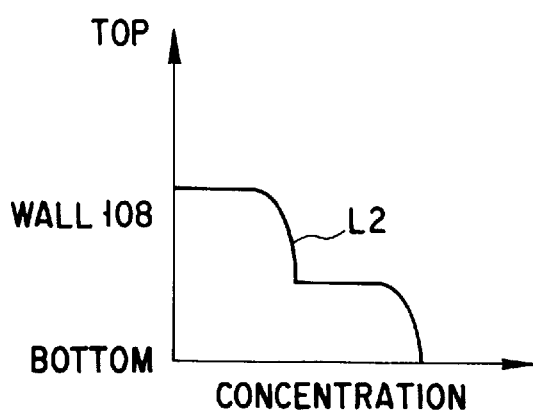

The concentration of the heat generating elements 108b in the matrix may have a gradient continuous or discontinuous as shown in FIG. 7A with a line L1 or FIG. 7B with a line L2, such that the concentration is higher on the exposed inner surface side. With this arrangement, energy from the RF antenna 110 is efficiently used for selectively and inductively heating up the exposed inner surface of the ceiling wall 108.

The matrix 108a and the heat generating elements 108b may be formed from a dielectric material and a conductive material, respectively, other than the above-described materials. For example, alumina may be used as a dielectric material for the matrix 108a while titanium (Ti) or tungsten (W) may be used as a conductive material for the heat generating elements 108b. The conductive material can be diffused in the matrix by impregnating an alumina substrate with a solution of a salt of Ti or W, and then heat-treating the substrate.

Figure 3:
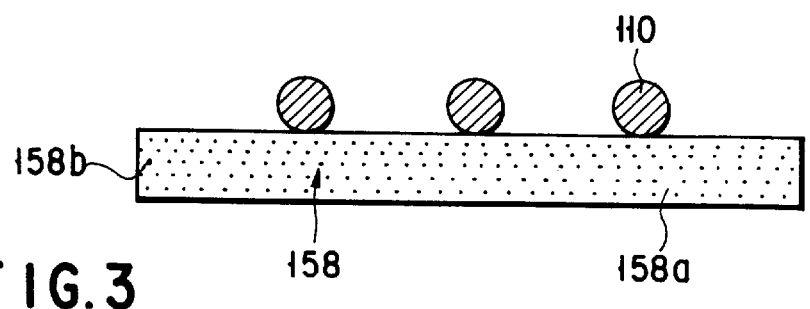
FIG. 3 is a cross-sectional view showing a modification of the ceiling wall of the apparatus shown in FIG. 1.

FIG. 3 is a cross-sectional view showing a modification 158 of the ceiling wall of the apparatus 100 shown in FIG. 1.

As shown in FIG. 3, the ceiling wall 158 has a matrix 158a consisting essentially of a semiconductor, such as silicon or germanium. The matrix 158a is caused to generate heat (joule heat) by the RF electric field, and heat up the inner surface of the ceiling wall 158 exposed to the process chamber 102, so that the exposed inner surface is prevented from being stained with by-products during a plasma process.

The ceiling wall 158 also has auxiliary heat generating elements 158b dispersed in the matrix 158 and capable of self-generating heat, using an RF electric field generated by the RF antenna 110. The auxiliary heat generating elements 158b increase the calorific value of the exposed inner surface of the ceiling wall 158.

In order to dope the matrix 158a with the auxiliary heat generating elements 158b, i.e., a conductive impurity, a method can be used such that the two materials are mixed and then sintered. The amount and size of the auxiliary heat generating elements 158b are decided in consideration of various factors, such as the calorific value, durability, workability of the ceiling wall 158.

The concentration of the auxiliary heat generating elements 158b in the matrix may have a gradient continuous or discontinuous as shown in FIG. 7A with a line L1 or FIG. 7B with a line L2, such that the concentration is higher on the exposed inner surface side. With this arrangement, energy from the RF antenna 110 is efficiently used for heating up the exposed inner surface of the ceiling wall 158.

The ceiling wall 158 may be made only of an intrinsic semiconductor, such as silicon or germanium, without mixing the auxiliary heat generating elements 158b. Instead, the ceiling wall 158 may be made of a semiconductor doped with a carrier impurity of n- or p-conductivity type. In this case, a concentration gradient as shown in FIG. 7A or 7B may be adopted.

According to the etching apparatus 100 shown in FIG. 1, which employs the ceiling wall 108 or 158 shown in FIG. 2 or 3, the ceiling wall 108 or 158 is heated by means of self-heat-generation, when an RF power for exciting a plasma is applied to the RF antenna 110 during a plasma process. Consequently, the exposed inner surface of the ceiling wall 108 or 158 is heated, so that the exposed inner surface is prevented from being stained with by-products during the plasma process. This heating structure is simpler than the case of using a heating coil embedded in a ceiling wall, and does not shorten the service life of the ceiling wall so much.

Figure 4:
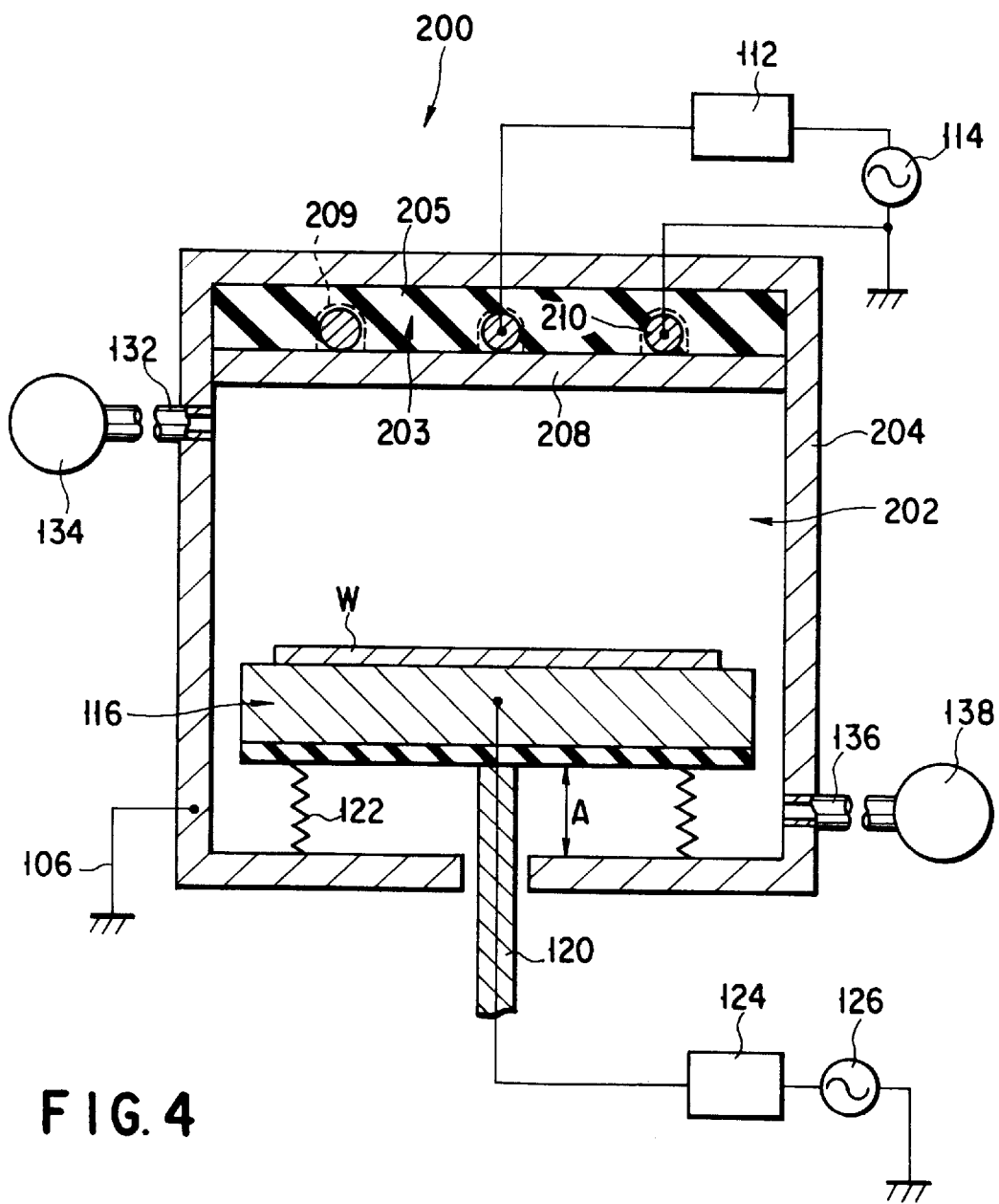
FIG. 4 is a schematic diagram showing an etching apparatus according to another embodiment of the present invention.

FIG. 4 is a schematic diagram showing an inductively coupled type dry etching apparatus 200 according to another embodiment of the present invention.

As shown in FIG. 4, the etching apparatus 200 differs from the etching apparatus 100 shown in FIG. 1 in that an RF antenna 210 is arranged in a process vessel 204. Specifically, the etching apparatus 200 has the process vessel 204 which is substantially cylindrical and airtight, and is made of a conductive material, such as stainless steel. The process vessel 204 is divided by a partition wall 208 consisting essentially of a dielectric material into airtight process and antenna chambers 202 and 203. The structure on the process chamber 202 side is essentially the same as that of the etching apparatus 100 shown in FIG. 1.

The antenna chamber 203 is completely filled with a filling layer 205 formed of a non-compacted powder of dielectric material, such as mica. In the lower portion of the filling layer 205, a spiral and band-like RF (radio-frequency) antenna 210 made of a conductive material, such as copper foil, is embedded. The RF antenna 210 is provided with a number of notches on the inside of its curve to absorb thermal stress. The RF antenna 210 is connected, through a matching unit 112, to a first RF power supply 114 which can output a plasma generating RF power, such as an RF power of 13.56 MHz.

The filling layer 205 may be formed by compacting a dielectric material powder or by molding a dielectric material. In this case, it is preferable to form a small bore 209 surrounding the RF antenna 210, as indicated with broken lines in FIG. 4, to prevent cracks from being generated in the filling layer 205 due to thermal expansion of the RF antenna 210. Instead, the antenna chamber 203 may not be filled with any dielectric material, but accommodate only the RF antenna 210. In this case, it is preferable to keep the antenna chamber 203 at a pressure of 100 Torr or more, in order not to excite a plasma therein.

Figure 5:
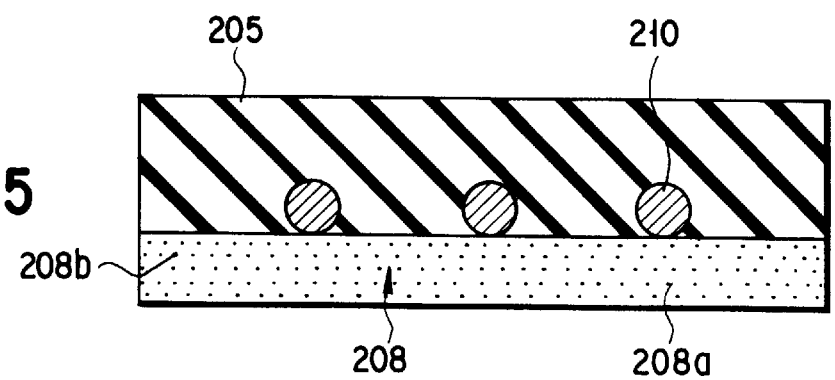
FIG. 5 is a cross-sectional view showing a partition wall used in the apparatus shown in FIG. 4.

FIG. 5 is a cross-sectional view showing a partition wall 208 used in the apparatus 200 shown in FIG. 4.

As shown in FIG. 5, the partition wall 208 has a matrix 208a consisting essentially of a dielectric material, and heat generating elements 208b dispersed in the matrix 208 and capable of self-generating heat, using an RF electric field generated by the RF antenna 210. The heat generating elements 208b is caused to generate heat by the RF electric field, and heat up the inner surface of the partition wall 208 exposed to the process chamber 202, so that the exposed inner surface is prevented from being stained with by-products during a plasma process.

The manufacturing method of the partition wall 208, and the conditions, such as the type, resistivity, concentration, and the like, of the matrix 208a and heat generating elements 208b, and their modifications are the same as those in the ceiling plate 108 shown in FIG. 2. Hence, no explanation will be given on these issues for the partition wall 208.

Figure 6:
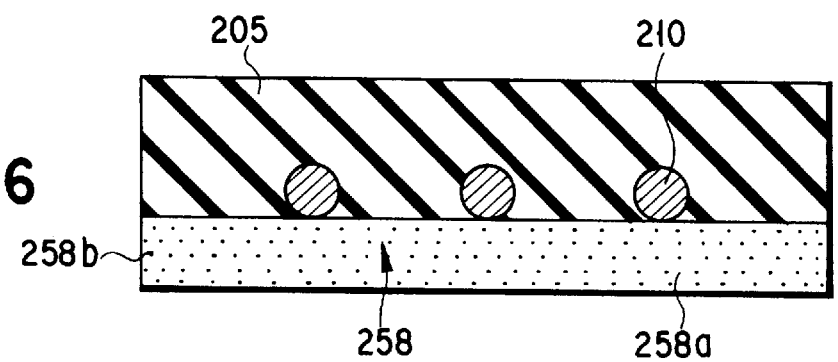
FIG. 6 is a cross-sectional view showing a modification of the partition wall of the apparatus shown in FIG. 4.

FIG. 6 is a cross-sectional view showing a modification 258 of the partition wall of the apparatus 200 shown in FIG. 4.

As shown in FIG. 6, the partition wall 258 has a matrix 258a consisting essentially of a semiconductor, such as silicon or germanium. The matrix 258a is caused to generate heat by the RF electric field, and heat up the inner surface of the partition wall 258 exposed to the process chamber 202, so that the exposed inner surface is prevented from being stained with by-products during a plasma process.

The partition wall 258 also has auxiliary heat generating elements 258b dispersed in the matrix 258 and capable of self-generating heat, using an RF electric field generated by the RF antenna 210. The auxiliary heat generating elements 258b increase the calorific value of the exposed inner surface of the partition wall 258.

The manufacturing method of the partition wall 258, and the conditions, such as the type, resistivity, concentration, and the like, of the matrix 258a and auxiliary heat generating elements 258b, and their modifications are the same as those in the ceiling plate 158 shown in FIG. 3. Hence, no explanation will be given on these issues for the partition wall 258.

According to the etching apparatus 200 shown in FIG. 4, which employs the ceiling wall 208 or 258 shown in FIG. 5 or 6, the ceiling wall 208 or 258 is heated by means of self-heat-generation, when an RF power for exciting a plasma is applied to the RF antenna 210 during a plasma process. Consequently, the exposed inner surface of the ceiling wall 208 or 258 is heated, so that the exposed inner surface is prevented from being stained with by-products during the plasma process. This heating structure is simpler than the case of using a heating coil embedded in a ceiling wall, and does not shorten the service life of the ceiling wall so much.

Further, in the etching apparatus 200 shown in FIG. 4, the energy of an RF power applied to the RF antenna 210 is confined in the process vessel 204. In addition, the partition wall 208 or 258 does not bear the pressure difference between the outside and inside of the process vessel 204, and thus can be thinner. As a result, a stronger electric field can be formed in the process chamber 202, so that a high-density plasma is excited in the process chamber 202 at a high energy efficiency.

In the embodiments shown in FIGS. 1 and 4, the process gas is directly supplied to the process chamber 102 from its side wall through the gas supply line 132. The process gas may be supplied from a shower head arranged at the upper portion in the process chamber 102.

Unlike the embodiments shown in FIGS. 1 and 4, the present invention can be applied to a plasma processing apparatus other than an etching apparatus, e.g., a film-forming apparatus or an ashing apparatus. The present invention can also be applied to a plasma processing apparatus for a target object other than a semiconductor wafer, e.g., an LCD glass substrate.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An apparatus for subjecting a target object to a plasma process by using a plasma, comprising:

an airtight process chamber formed in a process vessel;

a support member, arranged in said process chamber, for supporting said target object in said process chamber;

a gas supply system for supplying a process gas into said process chamber;

an exhaust system for exhausting and setting said process chamber at a vacuum;

an RF antenna for generating an RF electric field for exciting said process gas in said process chamber to convert said process gas into a plasma;

a power supply for supplying an RF power to said RF antenna; and an interposed wall which has an inner surface exposed to said process chamber and is interposed between said process chamber and said RF antenna;

wherein said interposed wall includes a matrix consisting essentially of a dielectric material, and heat generating elements consisting essentially of a conductive material, with which the dielectric material is doped, such that the heat generating elements are dispersed in said matrix and are capable of self-generating heat by said RF electric field.

2. The apparatus according to claim 1, wherein said interposed wall is formed of a sintered body.

3. The apparatus according to claim 2, wherein said dielectric material consists essentially of alumina ceramic and said heat generating elements consist essentially of a salt of a transition metal oxide.

4. The apparatus according to claim 1, wherein concentration of said heat generating elements has a gradient in said matrix, such that said concentration is higher on a side closer to said exposed inner surface.

5. The apparatus according to claim 1, wherein said interposed wall defines a ceiling of said process vessel, and said RF antenna is disposed outside said process vessel.

6. The apparatus according to claim 1, wherein said interposed wall and said RF antenna are arranged inside said process vessel.

7. The apparatus according to claim 6, further comprising a filling layer which consists essentially of a dielectric powder filling a space between an inner surface of said process vessel and said interposed wall, wherein said RF antenna is embedded in said filling layer.

8. The apparatus according to claim 6, further comprising a dielectric layer arranged between an inner surface of said process vessel and said interposed wall, and forming a bore surrounding said RF antenna.

9. The apparatus according to claim 1, wherein said process gas is a gas for etching said target object.

10. An apparatus for subjecting a target object to a plasma process by using a plasma, comprising:

an airtight process chamber formed in a process vessel;

a support member, arranged in said process chamber, for supporting said target object in said process chamber;

a gas supply system for supplying a process gas into said process chamber;

an exhaust system for exhausting and setting said process chamber at a vacuum;

an RF antenna for generating an RF electric field for exciting said process gas in said process chamber to convert said process gas into a plasma;

a power supply for supplying an RF power to said RF antenna; and an interposed wall which has an inner surface exposed to said process chamber and is interposed between said process chamber and said RF antenna;

wherein said interposed wall is formed of a sintered body which includes a matrix consisting essentially of a dielectric material, and heat generating elements doped in said matrix and capable of self-generating heat by said RF electric field; and wherein said dielectric material consists essentially of alumina ceramic and said heat generating elements consist essentially of a salt of a transition metal oxide.

11. The apparatus according to claim 10, wherein said heat generating elements consist essentially of a conductive material.

12. The apparatus according to claim 10, wherein a concentration of said heat generating elements has a gradient in said matrix, such that said concentration is higher on a side closer to said exposed inner surface.

13. The apparatus according to claim 10, wherein said interposed wall defines a ceiling of said process vessel, and said RF antenna is disposed outside said process vessel.

14. The apparatus according to claim 10, wherein said interposed wall and said RF antenna are arranged in said process vessel.

15. The apparatus according to claim 14, further comprising a filling layer which consists essentially of a dielectric powder filling a space between an inner surface of said process vessel and said interposed wall, wherein said RF antenna is embedded in said filling layer.

16. The apparatus according to claim 14, further comprising a dielectric layer arranged between an inner surface of said process vessel and said interposed wall, and forming a bore surrounding said RF antenna.

17. The apparatus according to claim 10, wherein said process gas is a gas for etching said target object.

* * * * *